United States Patent [19]

Urquhart et al.

[11] Patent Number: 5,264,070
[45] Date of Patent: Nov. 23, 1993

[54] METHOD OF GROWTH-ORIENTATION OF A CRYSTAL ON A DEVICE USING AN ORIENTED SEED LAYER

[75] Inventors: Andrew J. Urquhart; Ronald E. Pyle; Chi-Ming Hong, all of Austin, Tex.

[73] Assignee: Motorola, Inc., Schaumburg, Ill.

[21] Appl. No.: 594,498

[22] Filed: Oct. 9, 1990

[51] Int. Cl.⁵ ............................................. C30B 25/00
[52] U.S. Cl. ...................................... 156/603; 156/612; 156/647; 156/662; 156/DIG. 65; 437/83; 437/233; 437/109
[58] Field of Search ................. 156/603, 612, 613, 614, 156/647, 662, DIG. 61, DIG. 64, DIG. 65, DIG. 111; 437/62, 90, 83, 84, 108, 109

[56] References Cited

U.S. PATENT DOCUMENTS

| | | | |
|---|---|---|---|
| 3,918,149 | 11/1975 | Roberts | 437/199 |
| 3,929,528 | 12/1975 | Davidson et al. | 437/62 |
| 4,027,053 | 5/1977 | Lesk | 427/53 |
| 4,274,890 | 6/1981 | Varon | 437/108 |
| 4,359,486 | 11/1982 | Patalong et al. | 437/178 |
| 4,399,605 | 8/1983 | Dash et al. | 437/178 |
| 4,515,642 | 5/1985 | Ajima et al. | 437/143 |
| 4,772,564 | 9/1988 | Barnett et al. | 437/109 |
| 4,781,766 | 11/1988 | Barnett et al. | 437/109 |
| 4,989,064 | 1/1991 | Kubokoya et al. | 437/197 |

Primary Examiner—Olik Chaudhuri
Assistant Examiner—Felisa Garrett
Attorney, Agent, or Firm—Robert L. King

[57] ABSTRACT

Growth-orientation of a crystal on a semiconductor device is achieved by using an oriented seed layer to grow a monocrystalline layer of silicon on an oxide. The oriented seed layer is provided by a regimented layer of silicon precipitates, which are deposited onto a surface of the oxide in a conventional aluminum-silicon deposition process. A film of silicon is deposited onto the oriented seed layer to grow a monocrystalline layer of silicon. The monocrystalline layer of silicon is further coated with an oxide, and a further seed layer is deposited. In this manner, a plurality of monocrystalline layers of silicon can be deposited on and between insulating layers of oxide. The method can be used for the manufacture of silicon-on-oxide transistors, having a low density of crystalline defects.

15 Claims, 5 Drawing Sheets

METHOD OF GROWTH-ORIENTATION OF A CRYSTAL ON A DEVICE USING AN ORIENTED SEED LAYER

FIELD OF THE INVENTION

This invention relates generally to a method of producing a monocrystalline material, and more specifically relates to a method of growth-orientation of a crystal using an oriented seed layer.

BACKGROUND OF THE INVENTION

Semiconductor devices are usually fabricated on single crystal substrates, in which the number of crystalline defects is kept to a minimum. It is known that crystal defects can function as charge trapping sites, charge generation sites, and sites for contamination, which are capable of degrading the performance of a semiconductor device. Recent trends in the semiconductor industry have been towards higher degrees of integration. A known method of increasing the packing density of integrated circuits is to form semiconductor devices in thin films of a semiconductor material overlying each other, which is a method known as silicon-on-insulator (SOI). The method is known as SOI because thin films of silicon are deposited on an insulator, such as an oxide. In principle, multiple layers of such structures are possible, provided that the number of crystalline defects can be kept sufficiently low. Unfortunately, it is difficult to form monocrystalline layers over insulating materials such as an oxide, since these materials typically do not have a lattice structure. If a thin film of silicon is deposited over an oxide, for example, then the resulting film will have an amorphous or a polycrystalline structure. Such structures have a high density of Tam states (localized electronic states due to disorder). The disorder occurs because of crystalline defects such as grain boundaries, dislocations and intersticials. In order to achieve a monocrystalline layer of a material over an oxide, it is necessary to provide an oriented seed layer on the oxide, which can then be used as a lattice suitable for homoepitaxial or heteroepitaxial growth.

A known method for the manufacture of ribbons of polysilicon is taught by Israel A. Lesk in U.S. Pat. No. 4,027,053 entitled "Method of Producing Polycrystalline Silicon Ribbon" and assigned to the assignee hereof. The method uses a seed of silicon particulates which are broadcast on a quartz belt. The particulate sizes are generally in the range of 0.5 to 2 mils in diameter. A chemical vapor deposition process is used to grow a layer of polycrystalline silicon over and above the silicon particulates. The process forms a ribbon of polycrystalline material which is useful in the manufacture of solar cells. The ribbon can be converted into monocrystalline material, for example, by contacting it with a monocrystalline semiconductor material seed and heating the interface.

SUMMARY OF THE INVENTION

The invention provides an improved process for growth-orientation of a crystal on a device. In one form, the invention includes the steps of providing a substrate material, the substrate having a surface, and depositing a first layer having a crystalline precipitant to overlie the surface of the substrate. All the first layer, overlying and adjacent to the precipitants, is substantially removed to expose substantially only the precipitants overlying the substrate. The layer of precipitates provides a seed layer having a uniform crystal orientation which are each orthogonal to the surface of the substrate.

DESCRIPTION OF A PREFERRED EMBODIMENT

Figure 1A:
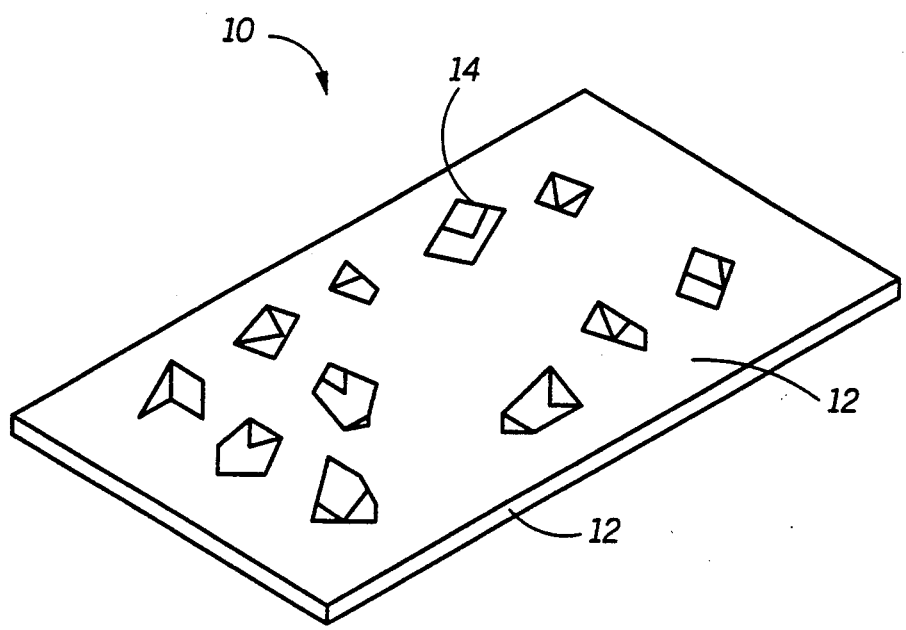
FIGS. 1(A) to (B) illustrate, in isometric form, a portion of a known seed layer.
Figure 1B:
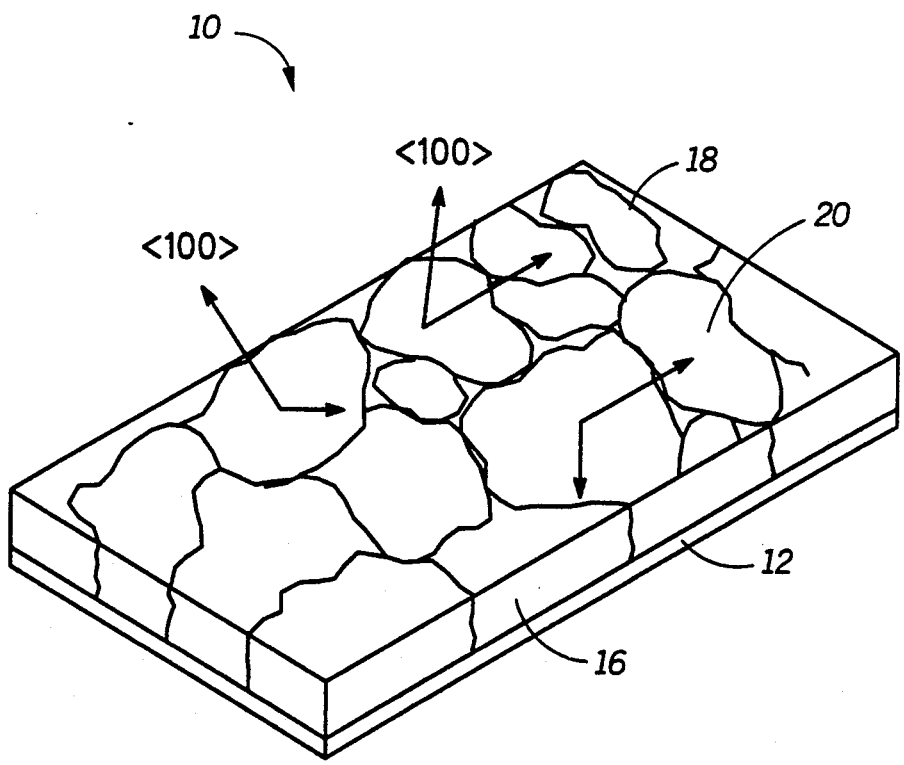

A known method for forming a ribbon of polysilicon is illustrated in FIG. 1(A) to FIG. 1(B). FIG. 1(A) illustrates, in isometric form, a portion of a ribbon seed layer 10 which has an insulating quartz layer 12. Insulating quartz layer 12 has been broadcast with semiconductor silicon particulates, such as a silicon particulate 14. The crystal orientation of the silicon particulates is randomly distributed on the surface of quartz layer 12.

In the preferred form, the ribbon seed is moved through a furnace tube (not shown) and subjected to a gaseous source such as silicon tetrachloride and hydrogen. Silicon deposits out of the silicon tetrachloride by a hydrogen reduction reaction, and onto the silicon particulates, such as silicon particulate 14, overlying quartz belt layer 12, at temperatures in the range of 1,000 to 1,200 degrees Centigrade. As the silicon is deposited onto the silicon particulates, some of the silicon pervades the spaces between the silicon seed particulates, depositing within the film and joining the particulates together to form a continuous ribbon of polycrystalline material.

FIG. 1(B) illustrates, in isometric form, further processing of the ribbon seed layer 10. A polycrystalline silicon layer 16 has been deposited to overlie ribbon seed layer 10. Polycrystalline silicon layer 16 has grain boundaries, such as a grain boundary 18, which surrounds the silicon particulate to form a silicon grain 20. Since the silicon deposition has occurred around each silicon particulate, which are randomly oriented, the resulting silicon grains are also randomly oriented, in a direction orthogonal to the surface of insulating quartz layer 12, and in a direction parallel to the surface of insulating quartz layer 12.

It is evident from the crystallographic structure of polycrystalline silicon layer 16, that the polycrystalline silicon layer has a high density of crystalline defects and it is necessary to recrystallize the polysilicon layer. It is usual to place the ribbon of polycrystalline material in intimate contact with a monocrystalline silicon substrate and then heat to re-crystallize the ribbon of polysilicon. A potential concern associated with this method is the recrystallization procedure, which requires substantial heat treatment and a mechanical contact with a monocrystalline layer. If the layers of polycrystalline silicon material are very thin, any mechanical contact to the surface of the polysilicon layer will cause severe damage.

A method of growth-orientation of a crystal using an oriented seed layer, in accordance with the present invention, provides two types of polysilicon structures. In a first embodiment, the grains of polycrystalline material are oriented only in one direction. In a second embodiment, the grains of polysilicon material are oriented in two direction, which provides a method for forming a monocrystalline layer of silicon on an insulator.

Figure 2A:
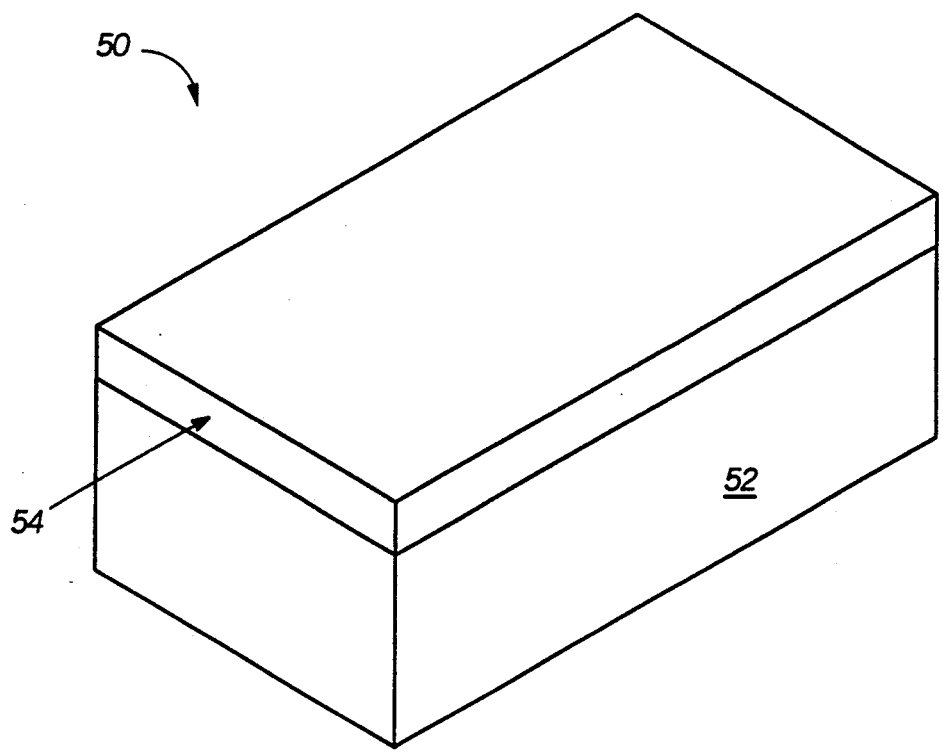
FIGS. 2(A) to (C) illustrate, in isometric form, in accordance with one embodiment of the present invention, a method of growth-orientation of a crystal on a device using an oriented seed layer.

FIGS. 2(A) to 2(E) illustrate, in isometric form, the first embodiment of the present invention, in which the grains of polysilicon are only oriented in one direction. FIG. 2(A) illustrates, in isometric form, a device 50, which in the preferred form is a semiconductor device, such as an SOI device. Device 50 has an insulating substrate 52, such as an oxide substrate, although other types of insulating substrates can be used. A first layer of material has been deposited overlying the surface of substrate 52, which forms a crystalline precipitate on the surface of substrate 52. The crystalline precipitate has the capability of functioning as a seed crystal for crystalline growth in a subsequent deposition process. For example, in the preferred embodiment, an aluminum-silicon polycrystalline layer 54 has been deposited onto substrate 52. In a conventional aluminum-silicon deposition process, it is usual for a silicon precipitate to form at the surface of the insulating substrate. The oxide substrate is not directly observable under the aluminum layer.

Figure 2B:
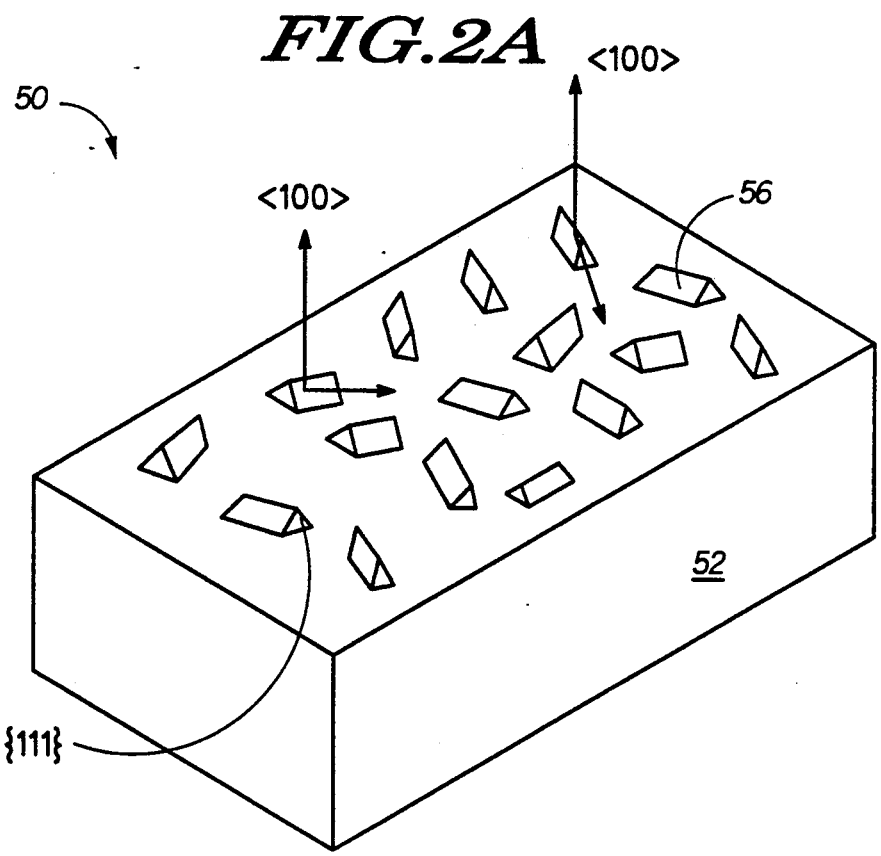

FIG. 2(B) illustrates, in isometric form, further processing of device 50. The aluminum-silicon polycrystalline layer 54 has been substantially removed using a conventional aluminum etch to leave silicon crystalline precipitates, such as a silicon precipitate 56 on the surface of substrate 52. It is worth noting that the precipitates of silicon will have a low concentration of aluminum which can be useful in the subsequent doping of a P-type SOI layer. Alternatively, an antimony-silicon layer can be used as layer 54, which is useful in the formation of an N-type SOI layer. An advantage of the doped SOI layers is the capability of forming SOI transistors, such as bipolar and MOS transistors. In order to successfully manufacture such transistors, it is necessary to produce SOI layers which have a very low density of silicon crystallographic defects. The advantage of the present invention, is the orientation of the crystalline grains which reduces the number of crystalline defects.

In the illustrated form, the crystal orientation of the silicon precipitates is substantially <100> in a direction orthogonal to the surface of substrate 52. The <100> orientation is the orientation exposing the lowest free energy surface. In other words, the surface having the lowest free energy, is the surface with the least number of dangling bonds (unsatisfied bonds). Unfortunately, the seed layer thus formed has a random crystallographic orientation in a direction parallel to the surface of the substrate, which introduces some crystallographic defects, but is much improved over previous methods. After the silicon precipitate seed has been formed in the manner described, a silicon layer can be deposited onto the seed layer to form a polycrystalline, silicon layer which will have the same orientation as the underlying seed layer.

Figure 2C:
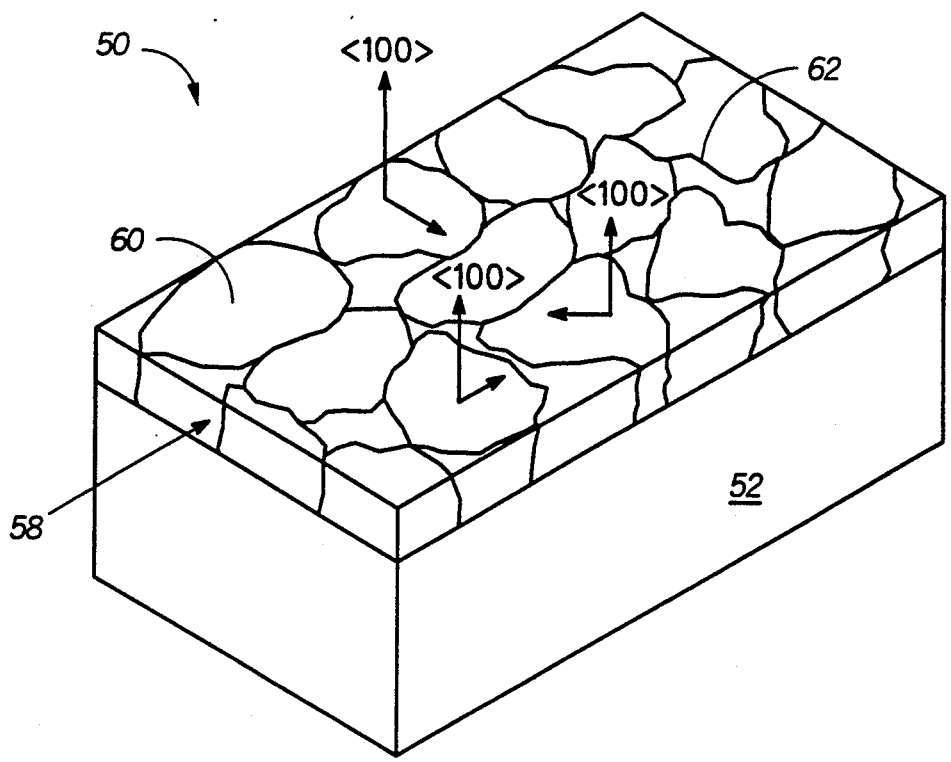

FIG. 2(C) illustrates, in isometric form, in accordance with the method of the present invention, further processing of device 50. A layer of silicon has been deposited over the seed layer formed of the silicon precipitates, to form a polysilicon layer 58. The silicon has primarily deposited on the precipitates which provide a seed for oriented silicon growth only in a direction orthogonal to the surface of substrate 52. Silicon has also deposited in between the seeds to form a continuous polysilicon layer overlying substrate 52. It should be noted that polysilicon layer 58 has a disordered structure, but not amorphous, and is comprised of grains (crystallites), such as a grain 60, having a crystallographic <100> direction, in a direction orthogonal to the surface of substrate 52. The grains of silicon are separated by grain boundaries, such as a grain boundary 62 (crystal boundaries.) The crystal orientation within each grain is randomly distributed, in a direction parallel to the surface of substrate 52.

An advantage of the device 50 is the reduction of crystallographic defects, which is due to the orientation of the precipitates providing the seed layer for subsequent crystallographic growth. Note that no mechanical contact of device 50 to monocrystalline silicon is made.

The second embodiment, of the present invention, is illustrated in FIGS. 3(A) to (D) and provides a method of orienting the precipitates of the seed layer in two directions. The two directions are the direction orthogonal to the surface of substrate 52, and the direction parallel to the surface of the substrate 52.

Figure 3A:
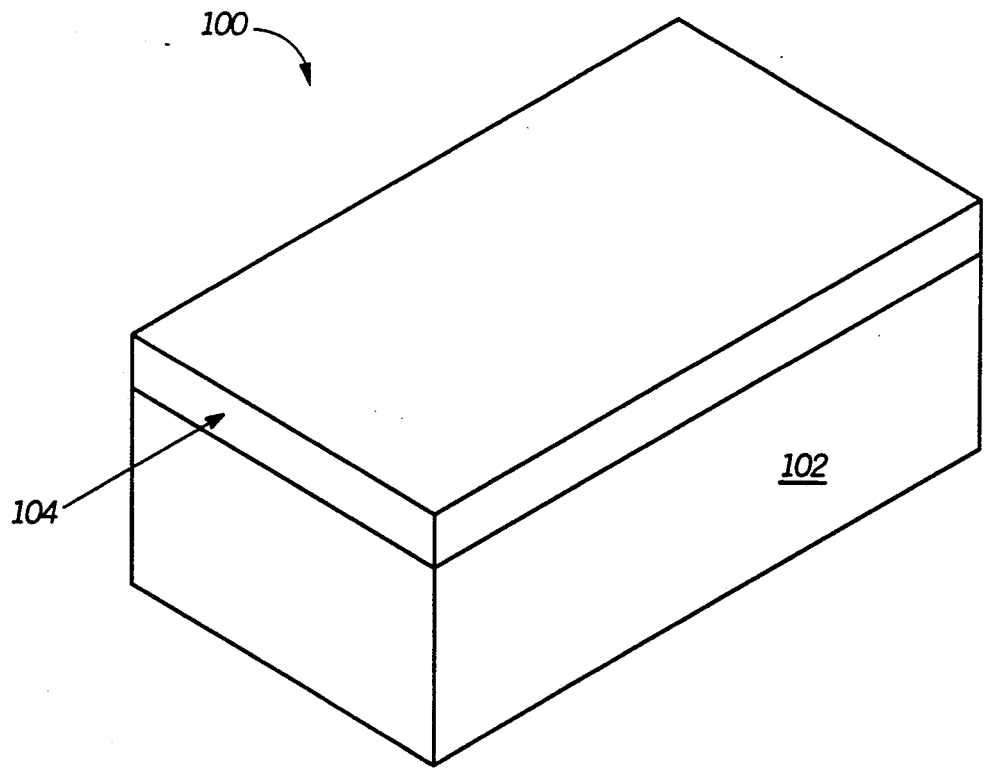
FIGS. 3(A) to (E) illustrate, in isometric form, in accordance with another embodiment of the present invention, a method of growth-orientation of a crystal on a device using an oriented seed layer.

FIG. 3(A) illustrates, in isometric form, a device, which in the preferred form is a semiconductor device, such as an SOI device 100. SOI device 100 has an oxide substrate 102, although other insulating substrates can be used. A first layer of material has been deposited on the surface of substrate 102 which forms a polycrystalline layer on the surface of substrate 102. The polycrystalline layer has a crystalline precipitate, not visible under the layer, which has the capability of functioning as a seed layer for crystalline growth, in a subsequent deposition process. For example, in the preferred embodiment, an aluminum-silicon layer 104 has been deposited onto substrate 102. In a conventional aluminum-silicon deposition process, it is usual for a silicon precipitate to form at the surface of the insulating substrate. The silicon precipitates, under the aluminum-silicon layer are not directly observable.

Figure 3B:
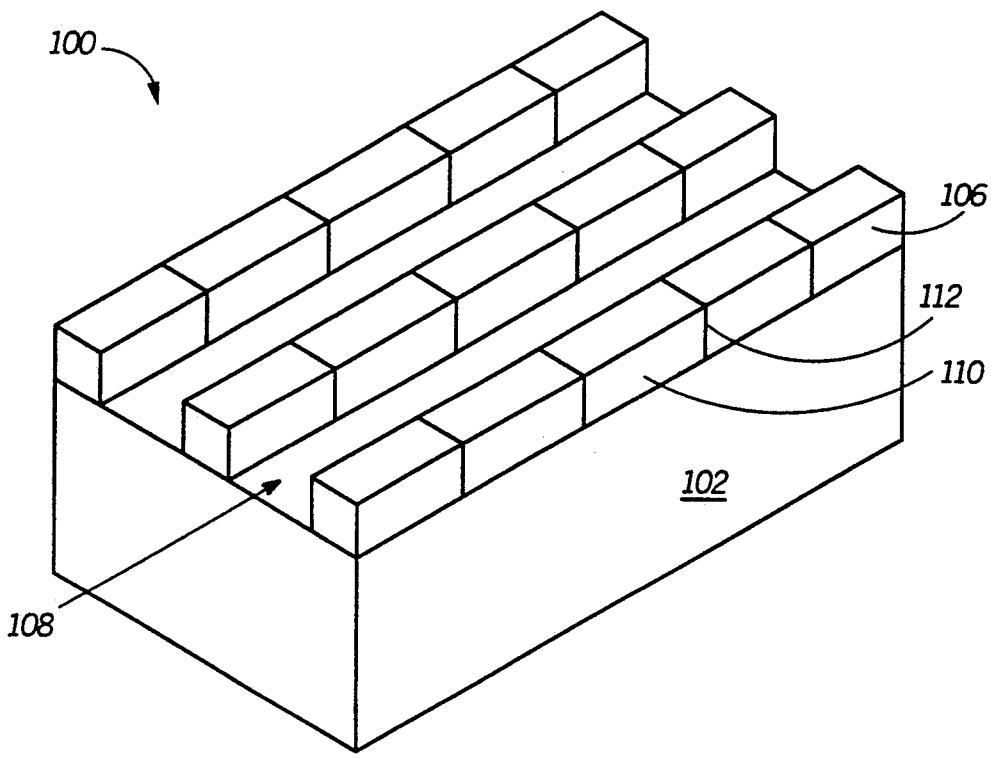

FIG. 3(B) illustrates, in sisometric form, in accordance with the method of the present invention, further processing of SOI device 100. The layer of aluminum-silicon has been patterned using conventional photolithography to form a pattern of lines and spaces, such as a line 106 and a space 108. SOI device 100 has been treated to form a crystallographic grain structure in the patterned lines, such as line 106. The patterned lines have grains, such as a grain 110 surrounded by a grain boundary 112. If the physical dimensions of the patterned lines, such as line 106 are less than substantially one micron wide, the grains in the aluminum-silicon layer will be substantially orthogonal to the direction of line 106. Silicon precipitates, present in the patterned lines, will predominate in the region of the grains, such as grain boundary 112. Therefore, the silicon precipitates in the regions of the grain boundaries have become aligned, in a direction orthogonal to the pattern lines, using conventional photolithography. The precipitates, within the grain boundaries of the aluminum-silicon lines, such as line 106 are not observable.

Figure 3C:
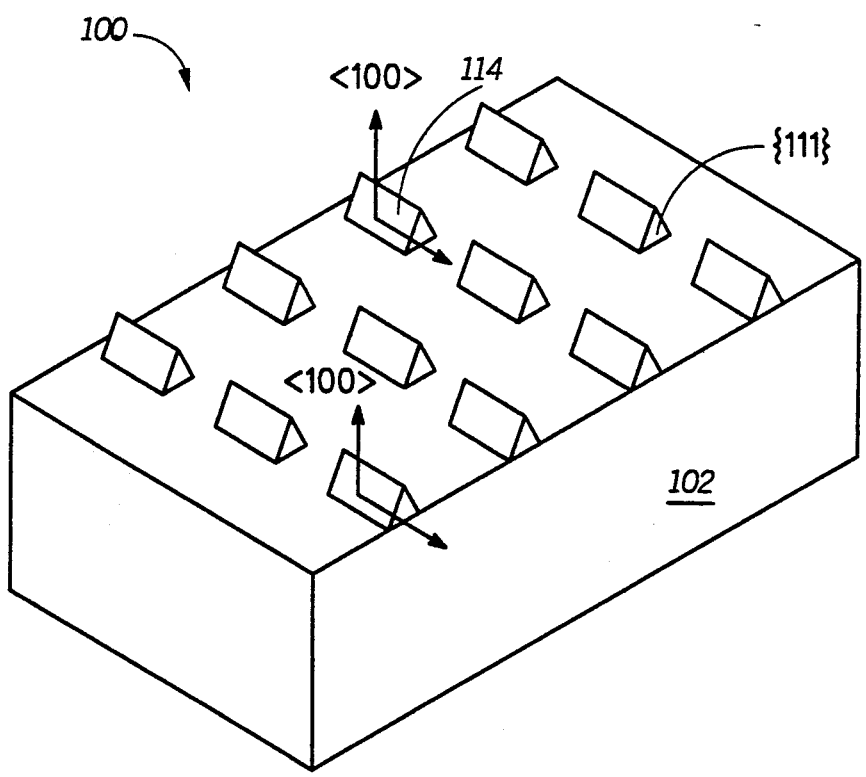

FIG. 3(C) illustrates, in isometric form, in accordance with the method of the present invention, further processing of SOI device 100. SOI device 100 has the aluminum-silicon patterned lines removed to expose the silicon precipitates. An advantage of the method, of the present invention, is the orientation of the silicon precipitates, such as a silicon precipitate 114, which is oriented in two directions. The precipitate is oriented in a direction orthogonal to the surface of substrate 102, and in a direction parallel to the surface of substrate 102. The array of oriented silicon precipitates provides a seed layer which is suitable for growth-orientation of a substantially monocrystalline silicon layer on the seed layer, such as that illustrated in FIG. 3(D).

Figure 3D:
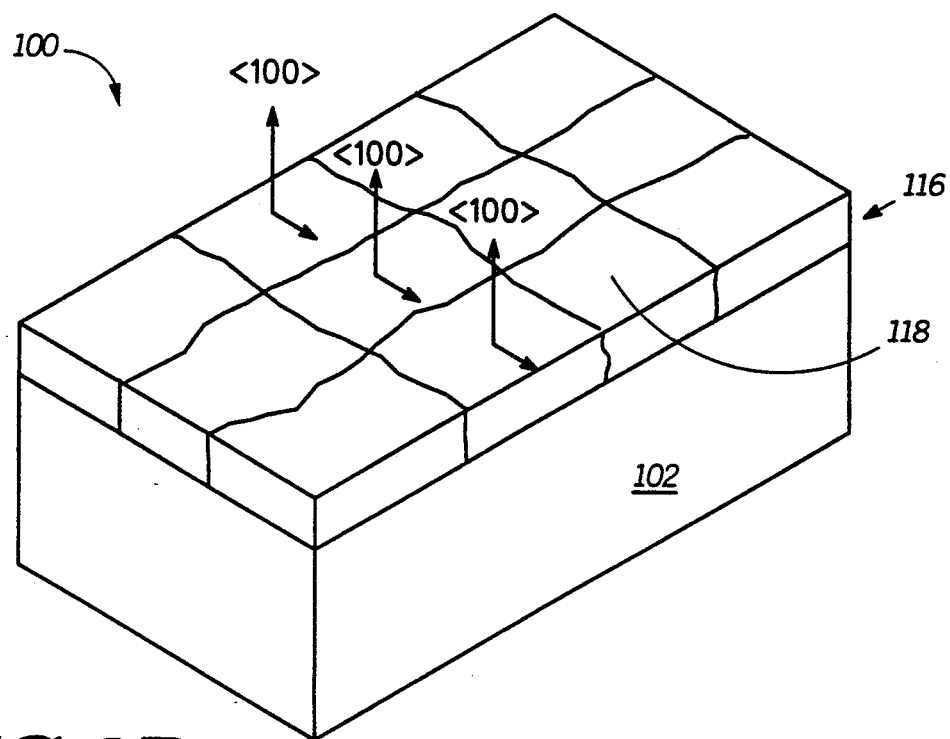

FIG. 3(D) illustrates, in isometric form, further processing of SOI device 100. A layer of silicon has been deposited on SOI device 100 to form a monocrystalline silicon layer 116. The monocrystalline silicon layer has silicon grains, such as a silicon grain 118 and has substantially the same crystal orientation as the underlying silicon precipitate, which provided the seed for crystal growth. An advantage of monocrystalline silicon layer 116 is a reduction in the number of disorder energy states within the silicon. Disorder in the crystalline structure of semiconductor affects the electrical properties of such semiconductors. For example, a high degree of disorder will produce a high number of localized energy states within the crystal. Further heat treatment of SOI device 100 can further reduce the number of crystal defects to an almost negligible amount. A further advantage of the present invention is the capability of forming vertical stacks of SOI layers, such as SOI device 100 illustrated in FIG. 3(E).

Figure 3E:
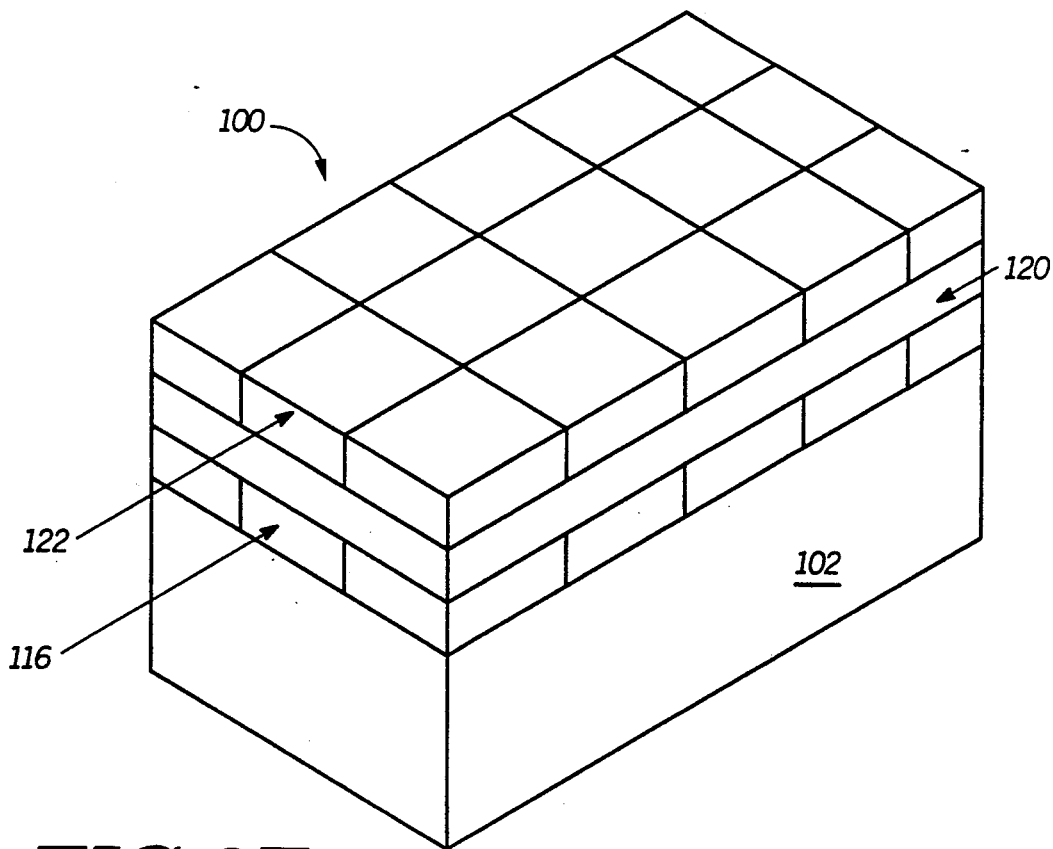

FIG. 3(E) illustrates, in isometric form, further processing of SOI device 100. An insulating material, such as a first interlevel oxide 120, is deposited to overlie monocrystalline silicon layer 116. The method of the present invention is used to deposit a second monocrystalline layer 122 to overlie first interlevel oxide 120. In one form, SOI device 100 has been heat treated using a conventional annealing process to further reduce the number of grain boundaries. An advantage of SOI device 100 is the capability of forming vertical stacks of semiconductor transistors (not shown). The vertical stacks form intergrated circuits having a high degree of integration. In another form, the stacks can provide very efficient solar cells. In yet another form, the stacks are formed, for example of silicon and cadmium mercury telluride, which can be used as the basis of focal plane, infrared optical detectors.

By now it should be apparent that there has been provided a process for growth-orientation of a crystal on a device using an oriented seed layer, which can be used, for example, to grow monocrystalline layers of silicon on an insulator such as an oxide. Examples of such devices are SOI transistors, solar cells and photodetectors. In addition to the advantages of providing a method for growing a monocrystalline layer of silicon on an oxide, the method of the present invention can be used to grow other crystalline layers on a variety of materials.

While there have been described herein the principles of the invention, it is to be clearly understood by those skilled in the art that this description is made only by way of example, and not as a limitation to the scope of the invention. For example, the substrate can be formed of silicon nitride and the monocrystalline layer can be formed of P-type or N-type silicon. Accordingly, it is intended, by the appended claims, to cover all modifications of the invention which fall within the true spirit and scope of the invention.

We claim:

1. A method of growth-orientation of a crystal on a device using an oriented seed layer comprising the steps of:
   providing a substrate material, the substrate having a surface;
   depositing a first layer which has a crystalline precipitant which overlies the surface of the substrate;
   removing substantially all the first layer overlying and adjacent the precipitants to expose substantially all of each of the precipitants overlying the substrate as the seed layer, the precipitants having uniform crystal orientation which are each orthogonal to the surface of the substrate; and
   depositing at least one additional layer of material overlying the first layer, the at least one additional layer also having a uniform crystal orientation orthogonal to the surface of the substrate.

2. The method of claim 1 wherein the precipitants have uniform crystal orientation which is both orthogonal and parallel to the substrate and the step of depositing at least one additional layer of material overlying the first layer further comprises depositing a layer of silicon to form a polysilicon layer.

3. The method of claim 1 wherein prior to the removal of the first layer, the method further comprises the steps of:
   patterning the first layer so as to form discrete lines and spaces in the first layer, the spaces exposing the precipitants overlying the surface of the substrate;
   removing the precipitates within the spaces;
   treating the patterned first layer to align grains of the first layer in a uniform direction having uniform crystal orientation both orthogonal and parallel to the surface of the substrate; and
   removing substantially all the first layer overlying the precipitants to expose the precipitants overlying the substrate.

4. The method of claim 3 wherein the precipitants have uniform crystal orientation which is both orthogonal and parallel to the substrate and the step of depositing the at least one additional layer of material to overlie the seed layer further comprises depositing a layer of silicon to form a polysilicon layer having a uniform crystal orientation both orthogonal and parallel to the surface of the substrate.

5. The method of claim 3 wherein the step of depositing the at least one additional layer of material overlying the first layer further comprises providing the at least one additional layer having a uniform crystal orientation both orthogonal and parallel to the surface of the substrate.

6. A method of growth-orientation of a crystal on a semiconductor device using an oriented seed layer comprising the steps of:
   providing an insulating substrate, the insulating substrate having a surface;
   depositing a binary alloy layer which has a crystalline precipitant which overlies the surface of the insulating substrate;
   removing substantially all the binary alloy layer overlying and adjacent the precipitants to expose substantially only the precipitants overlying the substrate as the seed layer, the precipitants having uniform crystal orientation which are each orthogonal to the surface of the insulating substrate; and
   depositing at least one additional layer of material overlying the binary alloy layer, the at least one additional layer also having a uniform crystal orientation orthogonal to the surface of the insulating substrate.

7. The method of claim 6 wherein the step of depositing the at least one additional layer of material to overlie the seed layer further comprises depositing a layer of silicon to form a polysilicon layer.

8. The method of claim 6 wherein prior to the removal of the binary alloy layer the method further comprises the steps of:
patterning the binary alloy layer so as to form discrete lines and spaces in the binary alloy, the spaces exposing the precipitants overlying the surface of the insulating substrate;
removing the precipitates within the spaces;
treating the patterned binary alloy layer to align grains of the binary alloy layer in a uniform direction having uniform crystal orientation both orthogonal and parallel to the surface of the insulating substrate; and
removing substantially all the binary alloy layer overlying the precipitants to expose the precipitants overlying the insulating substrate.

9. The method of claim 8 wherein the step of depositing the at least one additional layer of material to overlie the seed layer further comprises depositing a layer of silicon to form a polysilicon layer.

10. The method of claim 8 wherein the precipitants have uniform crystal orientation which is both orthogonal and parallel to the substrate and the step of depositing the at least one additional layer of material overlying the binary alloy layer further comprises depositing a layer of silicon to form a polysilicon layer having a uniform crystal orientation both orthogonal and parallel to the surface of the substrate.

11. A method of growth-orientation of a crystal on a semiconductor device using an oriented silicon seed layer comprising the steps of:
providing an oxide substrate, the oxide having a surface;
depositing an aluminum-silicon layer which has a silicon crystalline precipitant which overlies the surface of the oxide substrate;
removing substantially all the aluminum-silicon layer overlying and adjacent the silicon precipitants to expose substantially only the silicon precipitants overlying the oxide substrate as the seed layer, the silicon precipitants having uniform crystal orientation which are each orthogonal to the surface of the substrate; and
depositing at least one additional silicon layer overlying the silicon layer which overlies the seed layer, the at least one additional silicon layer also having a uniform crystal orientation orthogonal to the surface of the substrate.

12. The method of claim 11 wherein the precipitants have uniform crystal orientation which is both orthogonal and parallel to the substrate and the step of depositing a silicon layer to overlie the silicon seed layer further comprises depositing a polysilicon layer having a uniform crystal orientation both orthogonal and parallel to the surface of the substrate.

13. The method of claim 11 wherein prior to the removal of the aluminum-silicon layer the method further comprises the steps of:
patterning the aluminum-silicon layer so as to form discrete lines and spaces in the aluminum-silicon to expose the silicon precipitants overlying the surface of the oxide substrate in the spaces;
removing the silicon precipitates within the space;
treating the patterned aluminum-silicon layer to align grains of the aluminum-silicon in a uniform direction having uniform crystal orientation both orthogonal and parallel to the surface of the substrate; and
removing substantially all the aluminum-silicon layer overlying the silicon precipitants to expose the silicon precipitants overlying the substrate.

14. The method of claim 13 wherein the step of depositing a silicon layer to overlie the silicon seed layer further comprises depositing a layer of silicon to form a polysilicon layer.

15. The method of claim 13 wherein the precipitants have uniform crystal orientation which is both orthogonal and parallel to the substrate and the step of depositing at least one additional silicon layer overlying the silicon layer further comprises depositing a layer of silicon to form a polysilicon layer having a uniform crystal orientation both orthogonal and parallel to the surface of the substrate.

* * * * *